(12) United States Patent  
Kurokawa et al.

(10) Patent No.: US 11,404,357 B2  
(45) Date of Patent: Aug. 2, 2022

(54) SEMICONDUCTOR DEVICE

(71) Applicant: Murata Manufacturing Co., Ltd., Kyoto-fu (JP)

(72) Inventors: Atsushi Kurokawa, Nagaokakyo (JP); Hiroaki Tokuya, Nagaokakyo (JP); Kazuya Kobayashi, Nagaokakyo (JP); Yuichi Sano, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 36 days.

(21) Appl. No.: 16/749,904

(22) Filed: Jan. 22, 2020

(65) Prior Publication Data

US 2020/0161226 A1 May 21, 2020

Related U.S. Application Data

(63) Continuation of application No. PCT/JP2018/025762, filed on Jul. 6, 2018.

(30) Foreign Application Priority Data

Jul. 24, 2017 (JP) .............................. JP2017-142972

(51) Int. Cl.
 *H01L 23/00* (2006.01)
 *H01L 23/495* (2006.01)

(52) U.S. Cl.
 CPC ........ *H01L 23/49555* (2013.01); *H01L 24/05* (2013.01); *H01L 24/13* (2013.01); *H01L 24/45* (2013.01); *H01L 2924/01079* (2013.01)

(58) Field of Classification Search
 CPC ............... H01L 23/49555; H01L 24/05; H01L 2224/0401; H01L 2224/04042;
 (Continued)

(56) References Cited

U.S. PATENT DOCUMENTS

2006/0125118 A1* 6/2006 Yamazaki ............... H01L 24/03  
257/784  
2011/0186962 A1* 8/2011 Moriyama .............. H01L 24/05  
257/529

(Continued)

FOREIGN PATENT DOCUMENTS

JP H02-139931 A 5/1990  
JP H05-109813 A 4/1993  
(Continued)

OTHER PUBLICATIONS

International Search Report issued in PCT/JP2018/025762; dated Aug. 14, 2018.

(Continued)

*Primary Examiner* — Brigitte A Paterson  
*Assistant Examiner* — Lawrence C Tynes, Jr.  
(74) *Attorney, Agent, or Firm* — Studebaker & Brackett PC

(57) ABSTRACT

A dielectric film is disposed on a semiconductor substrate, and a conductor including a bent section is arranged between the semiconductor substrate and the dielectric film. A pad is disposed on the dielectric film. The pad is covered with a protective film. The protective film has an opening through which an upper surface of the pad is exposed. The bent section in the conductor and the pad overlap each other as seen in plan view, and an inside corner and an outside corner in the bent section are chamfered.

20 Claims, 14 Drawing Sheets

(58) Field of Classification Search
CPC . H01L 2224/48463; H01L 2224/05568; H01L 2224/13082; H01L 2224/02166
See application file for complete search history.

(56) References Cited

U.S. PATENT DOCUMENTS

| | | | |
|---|---|---|---|
| 2015/0162296 A1* | 6/2015 | Risaki | H01L 24/05 257/774 |
| 2015/0270814 A1* | 9/2015 | Ban | H03F 3/08 250/214 A |
| 2016/0035672 A1* | 2/2016 | Funaya | H01L 22/14 257/531 |

FOREIGN PATENT DOCUMENTS

| | | |
|---|---|---|
| JP | H05-218021 A | 8/1993 |
| JP | H09-293723 A | 11/1997 |
| JP | 2004-266012 A | 9/2004 |
| JP | 2007-027264 A | 2/2007 |
| JP | 2007-067332 A | 3/2007 |
| JP | 2008-306703 A | 12/2008 |
| JP | 2011-222963 A | 11/2011 |
| JP | 2012-028549 A | 2/2012 |

OTHER PUBLICATIONS

International Preliminary Report on Patentability and Written Opinion issued in PCT/JP2018/025762; dated Jan. 28, 2020.

* cited by examiner

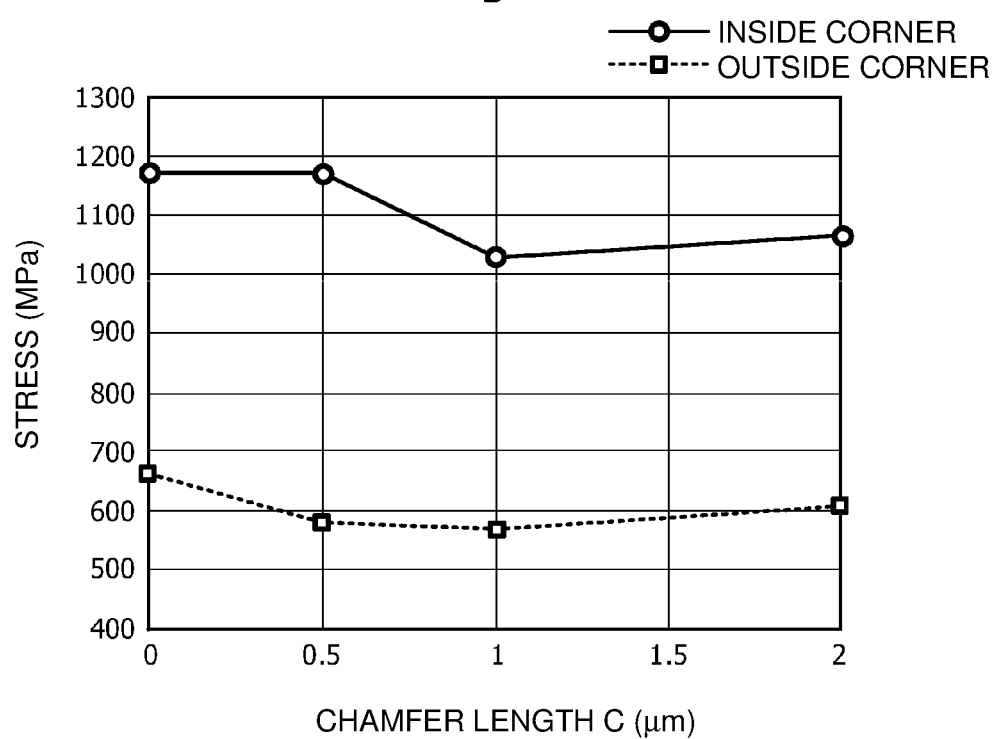

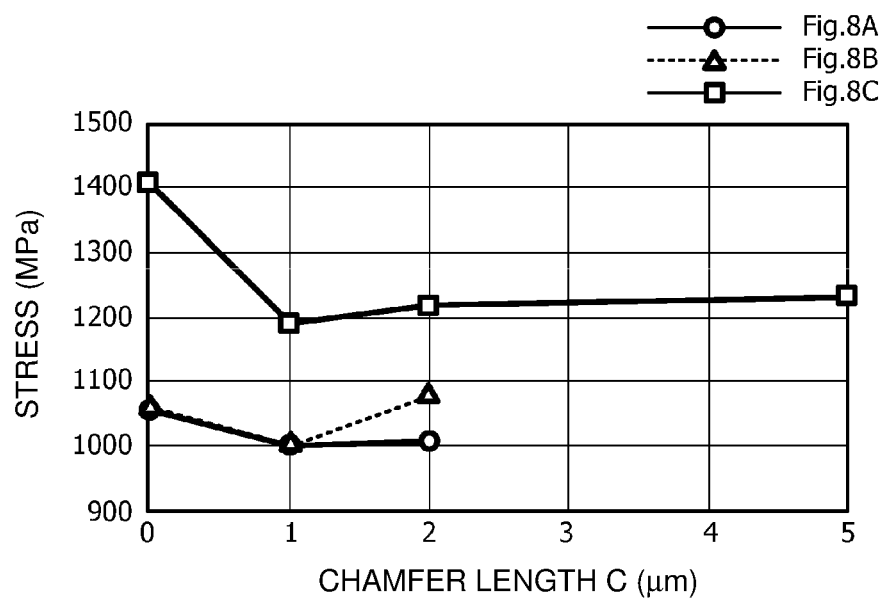

SEMICONDUCTOR DEVICE

CROSS-REFERENCE TO RELATED APPLICATIONS

This application claims benefit of priority to International Patent Application No. PCT/JP2018/025762, filed Jul. 6, 2018, and to Japanese Patent Application No. 2017-142972, filed Jul. 24, 2017, the entire contents of each are incorporated herein by reference.

BACKGROUND

Technical Field

The present disclosure relates to a semiconductor device.

Background Art

To reduce the size of a chip, a pad-on-element (POE) structure, in which a conductor or other similar element is arranged directly below a bonding pad, is adopted. The bonding pad is overlaid with a protective film, and the protective film has an opening through which the upper surface of the bonding pad is exposed. Through that opening, unfortunately, moisture can easily enter the semiconductor device. If the moisture through that opening reaches the conductor or other similar element directly below the bonding pad, corrosion of the conductor or other similar element advances, and the moisture resistance of the semiconductor device reduces.

In addition, for the POE structure, the conductor or an insulating film directly below the pad is susceptible to and easily damaged by an impact load during wire bonding. Some publicly known semiconductor devices have a structure in which a crack does not easily occur in an insulating film directly below a bonding pad during wire bonding, as described, for example, in Japanese Unexamined Patent Application Publication No. 2007-67332 and Japanese Unexamined Patent Application Publication No. 2004-266012.

The semiconductor device disclosed in Japanese Unexamined Patent Application Publication No. 2007-67332 includes first and second interlayer insulating films made of silicon dioxide ($SiO_2$) or other similar material and in which conductors made of aluminum (Al) or other similar material are embedded. A plurality of first conductors are embedded in the first interlayer insulating layer, and a plurality of second conductors are embedded in the second interlayer insulating layer. Each of the first conductors has a straight-line shape on a side below the pad and does not have a bend or a branch. With that configuration, stress caused by the first conductors can be suppressed, and the occurrence of cracks in the interlayer insulating layer or other element below the pad can be suppressed.

In the semiconductor device disclosed in Japanese Unexamined Patent Application Publication No. 2004-266012, an Al conductor arranged between a semiconductor substrate and a protrusion electrode has a slit. With the inclusion of the slit, a supersonic energy applied to the protrusion electrode during wire bonding can easily dissipate. This leads to a reduction in the occurrence of cracks.

There is a publicly known semiconductor device in which an Al conductor drawn from a pad has a corner section bent at a right angle and the corner section includes a chamfered portion as described, for example, in Japanese Unexamined Patent Application Publication No. 9-293723. The conductor segments meet at an angle larger than a right angle on both ends of the chamfered portion. Thus, excessive stresses are not placed on the corner section, and yields are improved.

SUMMARY

For the semiconductor device disclosed in Japanese Unexamined Patent Application Publication No. 2007-67332, it is impossible to arrange the bent area in the conductor directly below the pad. Japanese Unexamined Patent Application Publication No. 2004-266012 and Japanese Unexamined Patent Application Publication No. 9-293723 do not disclose a structure in which the conductor is bent directly below the pad.

Accordingly, the present disclosure provides a semiconductor device capable of suppressing a reduction in the moisture resistance, the occurrence of cracks, or the like when it includes a structure in which a conductor is bent directly below a pad.

A semiconductor device according to an aspect of the present disclosure includes a semiconductor substrate, a dielectric film disposed on the semiconductor substrate, a conductor arranged between the semiconductor substrate and the dielectric film and including a bent section, and a pad disposed on the dielectric film. The bent section in the conductor and the pad overlap each other as seen in plan view, and at least one of an inside corner and an outside corner in the bent section is chamfered.

The film quality of the dielectric film in the vicinity of the bent section is improved, and moisture does not easily enter the dielectric film. Thus, corrosion of the conductor or other element covered with the dielectric film can be suppressed. Moreover, stress occurring in the dielectric film can be reduced. Thus, the occurrence of cracks or the like can be suppressed, and the reliability can be enhanced.

BRIEF DESCRIPTION OF THE DRAWINGS

FIG. 7 illustrates graphs representing a simulation result;

FIG. 9 illustrates graphs representing a simulation result;

DETAILED DESCRIPTION

First Embodiment

A semiconductor device according to a first embodiment is described with reference to FIGS. 1A to 10.

Figure 1A:
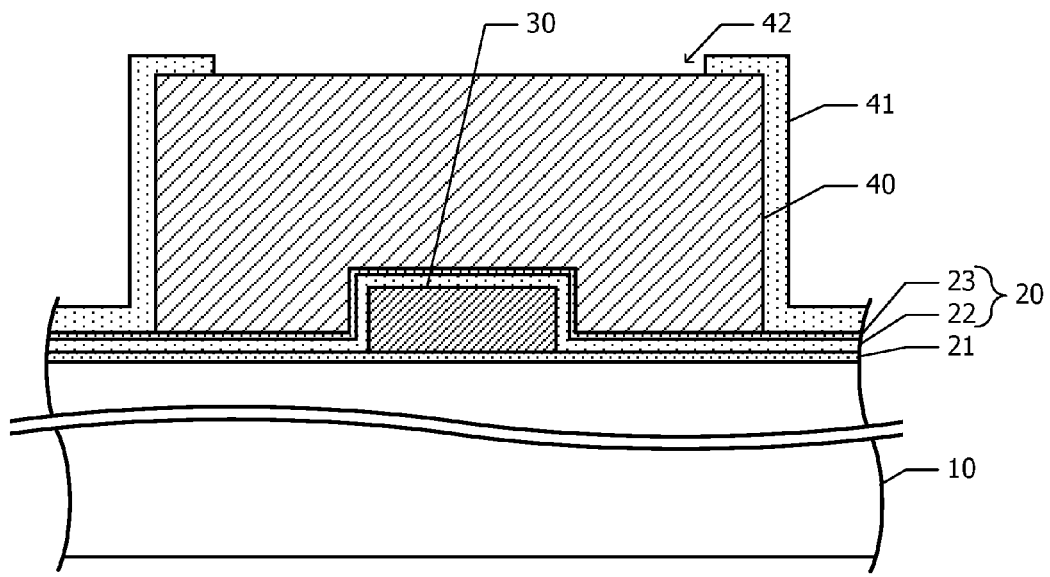
FIGS. 1A and 1B are a cross-sectional view and a plan view, respectively, of a portion of a semiconductor device according to a first embodiment.
Figure 1B:
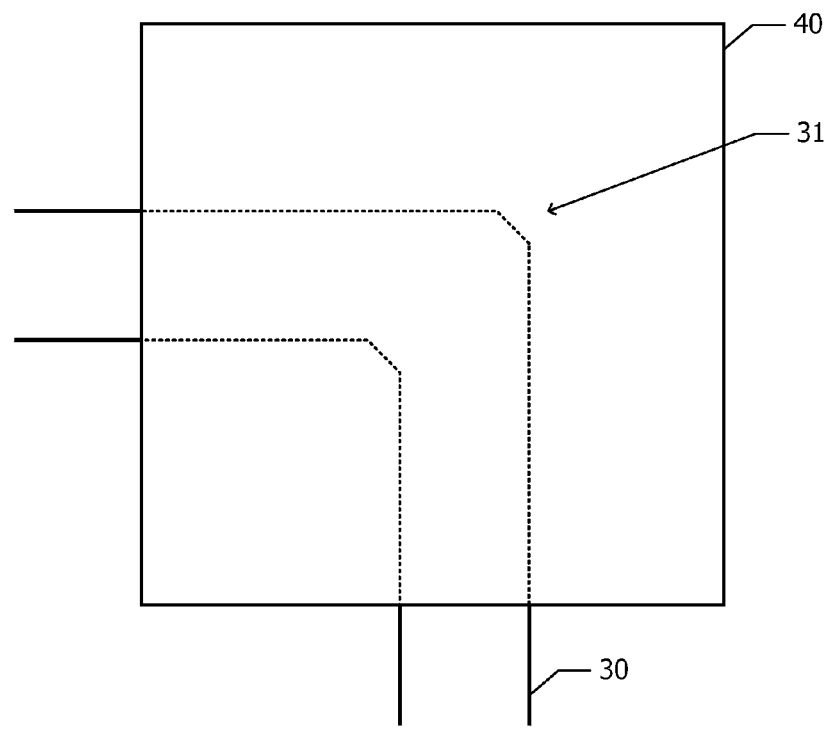

FIGS. 1A and 1B are a cross-sectional view and a plan view, respectively, of a portion of the semiconductor device according to the first embodiment. A first dielectric film 21 and a dielectric film 20 are disposed above a semiconductor substrate 10 in this order from the side of the semiconductor substrate 10. The dielectric film 20 includes two layers of a second dielectric film 22 and a third dielectric film 23. A conductor 30 is arranged on the first dielectric film 21. The conductor 30 is covered with the second dielectric film 22 and third dielectric film 23. That is, the conductor 30 is arranged between the semiconductor substrate 10 and dielectric film 20.

The conductor 30 is bent at a right angle at a bent section 31. A pad 40 is arranged on the dielectric film 20. The pad 40 overlaps the bent section 31 in the conductor 30 as seen in plan view. More specifically, the bent section 31 is positioned inside the pad 40. A protective film 41 is disposed on the dielectric film 20 and pad 40. The protective film 41 has an opening 42 through which the upper surface of the pad 40 is exposed.

Figure 2A:
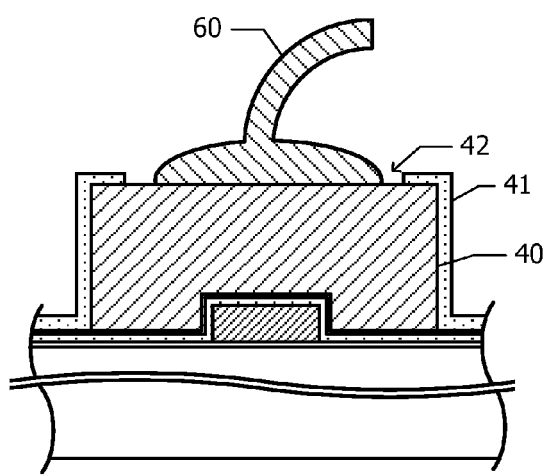
FIG. 2A is a cross-sectional view of a portion of the semiconductor device in a state where wire bonding is performed.

FIG. 2A is a cross-sectional view of a portion of the semiconductor device in a state where after the semiconductor device is fixed on a mounting substrate, a wire is bonded. A gold (Au) wire 60, in which a gold ball (Au ball) or other element is disposed, is bonded to the surface of the pad 40 exposed in the opening 42.

Figure 2B:
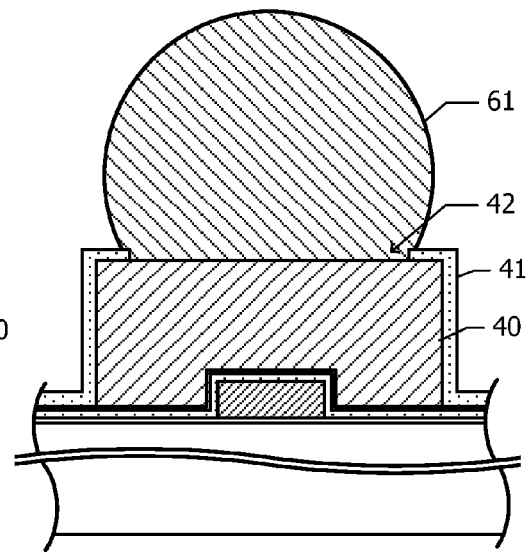
FIG. 2B is a cross-sectional view of a portion of the semiconductor device in a state where a solder ball bump is disposed.

FIG. 2B is a cross-sectional view of a portion of the semiconductor device in a state where a solder ball bump is disposed. A solder ball bump 61 is disposed on the pad 40 exposed in the opening 42.

Figure 2C:
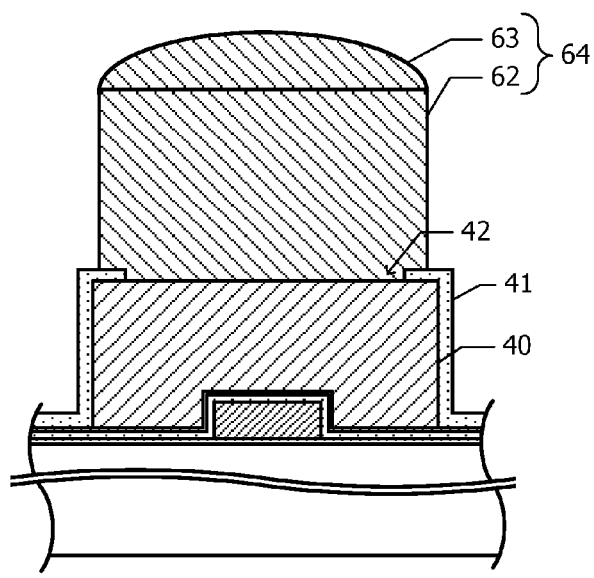
FIG. 2C is a cross-sectional view of a portion of the semiconductor device in a state where a copper (Cu) pillar bump is disposed.

FIG. 2C is a cross-sectional view of a portion of the semiconductor device in a state where a copper (Cu) pillar bump is disposed. A Cu pillar bump 64 is disposed on the pad 40 exposed in the opening 42. The Cu pillar bump 64 includes a Cu pillar 62 and solder 63 placed on the Cu pillar 62.

One example of the semiconductor substrate 10 may be a gallium arsenide (GaAs) substrate. In one example, a heterojunction bipolar transistor (HBT) may be disposed in a region of the upper surface of the semiconductor substrate 10 different from a region where the pad 40 is disposed. One example of each of the first dielectric film 21, dielectric film 20, and protective film 41 may be a silicon nitride (SiN) film. Example thicknesses of the first dielectric film 21, second dielectric film 22, third dielectric film 23, and protective film 41 may be 0.2 µm, 0.3 µm, 0.1 µm, and 0.5 µm, respectively. One example material of the conductor 30 and pad 40 may be gold (Au). Example thicknesses of the conductor 30 and pad 40 may be 1 µm and 4 µm, respectively. Each of the conductor 30 and pad 40 may have a multilayer structure including a plurality of metal layers. For example, a multilayer structure including a Au layer and a layer made of titanium (Ti) or other material arranged therebelow may be adopted. In that case, the Ti layer functions as an adhesive layer for enhancing adhesion between the underlying dielectric film and the Au layer.

Figure 3A:
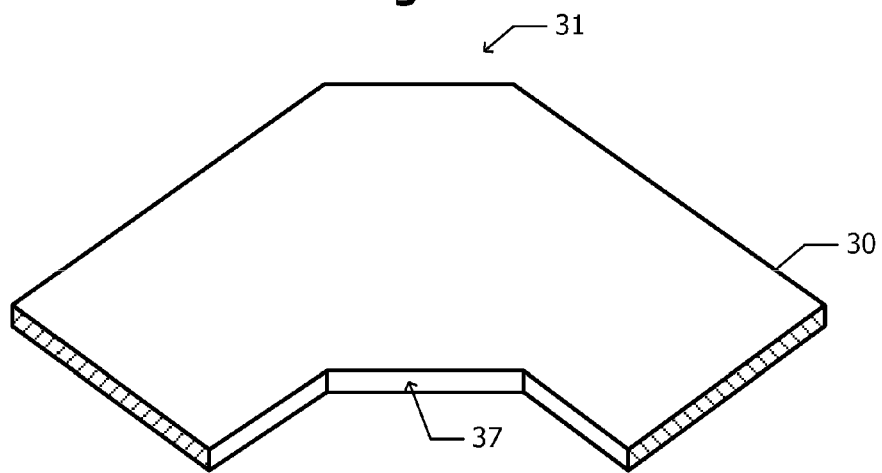
FIGS. 3A and 3B are a perspective view and a plan view, respectively, of a bent section in a conductor in the semiconductor device according to the first embodiment.
Figure 3B:
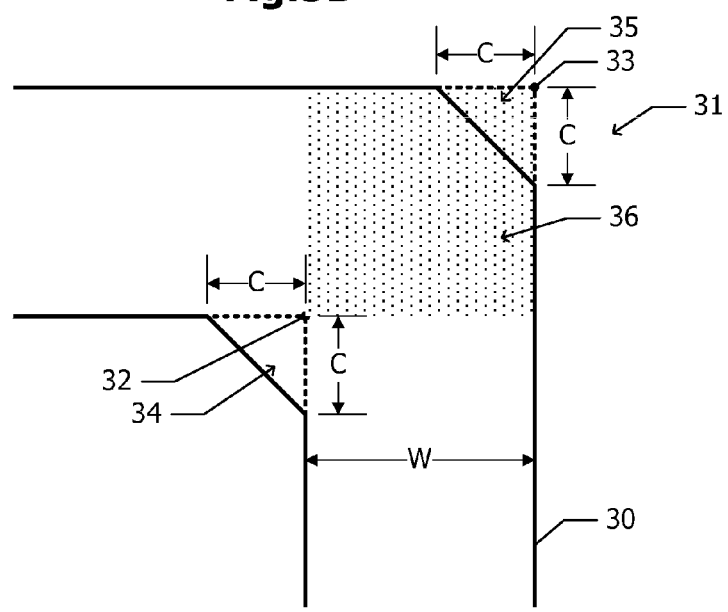

FIGS. 3A and 3B are a perspective view and a plan view, respectively, of the bent section 31 in the conductor 30. An inside corner 32 and an outside corner 33 in the bent section 31 are chamfered. The two-dimensional shape of each of a region 35 removed by chamfering the outside corner 33 in the bent section 31 and a region 34 added by chamfering the inside corner is an isosceles right triangle, and both are the same size. Hereinafter, the region 35, which is removed by chamfering, and the region 34, which is added by chamfering, are referred to as "chamfered regions." The length of each of two sides forming the right angle of each of the chamfered regions 34 and 35 is referred to as a chamfer length C. The surface corresponding to the hypotenuse of the chamfered region of the isosceles right triangle shape (chamfered surface) 37 is plane.

The outside chamfered region 35 is contained in a hatched quadrangular region 36 where a region extended from one straight-line segment of the conductor 30 contiguous to the bent section 31 and a region extended from another straight-line segment thereof overlap each other (hereinafter referred to as overlapping region). The chamfer length C is shorter than the conductor width W.

Next, advantages of the semiconductor device according to the first embodiment are described with reference to FIGS. 4A to 9. First, improvement of moisture resistance is described with reference to FIGS. 4A to 5B, and then a decrease in thermal stress is described with reference to FIGS. 6A to 9.

Figure 4A:
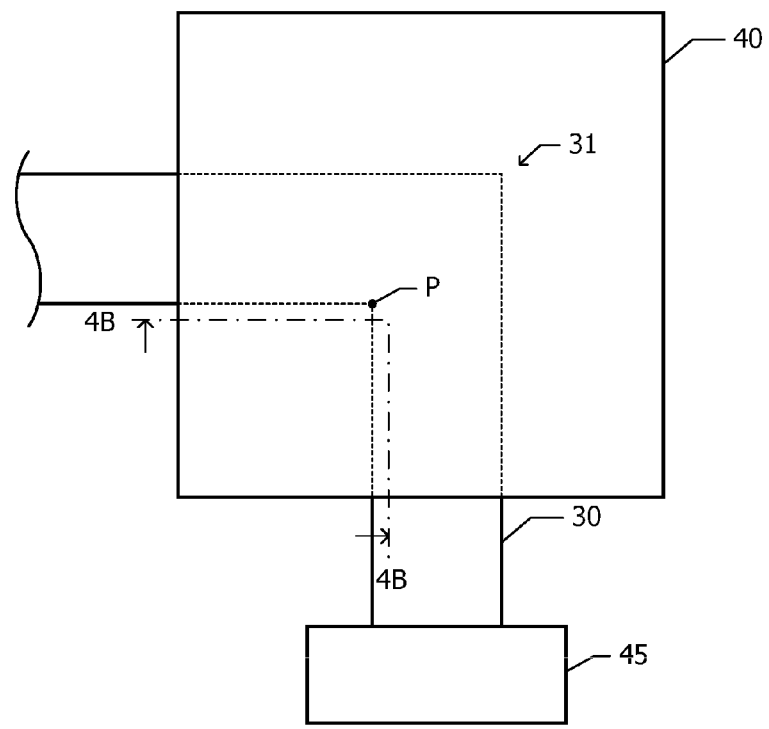
FIG. 4A is a plan view of a pad section in a semiconductor device according to a comparative example.

FIG. 4A is a plan view of a pad section in a semiconductor device according to a comparative example. In the comparative example, the conductor 30 is bent at a right angle inside the pad 40 as seen in plan view, and no chamfers are present in the bent section 31. One end of the conductor 30 is connected to a circuit element 45 arranged outside the pad 40 as seen in plan view. Examples of the circuit element 45 may include a heterojunction bipolar transistor, an active element, such as a field-effect transistor (FET), a thin-film resistor, and a capacitor.

Figure 4B:
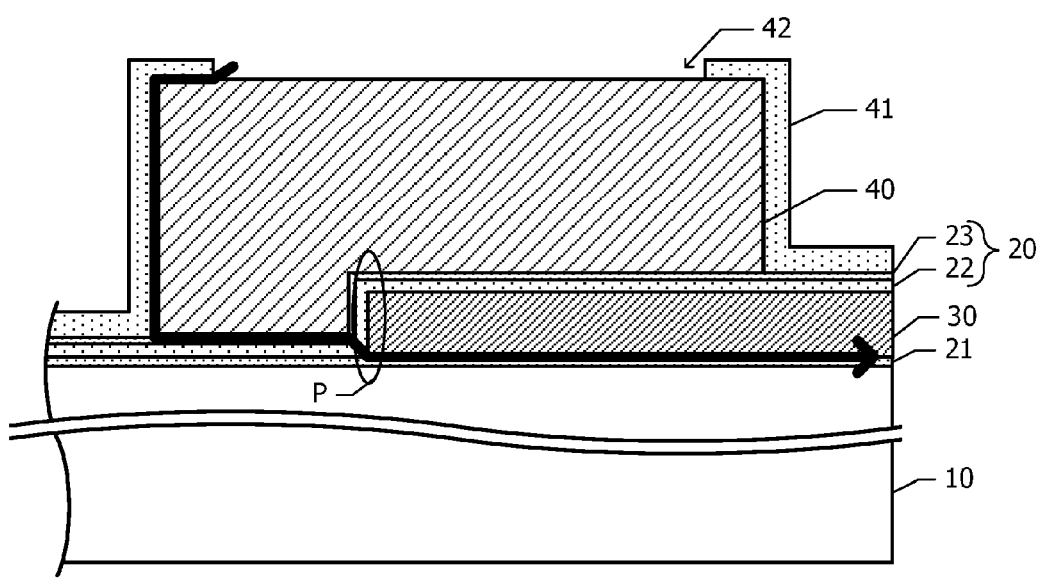
FIG. 4B is a cross-sectional view at a dot-and-dash line 4B-4B in FIG. 4A.

FIG. 4B is a cross-sectional view at a dot-and-dash line 4B-4B in FIG. 4A. The cross-sectional structure is the same as that of the semiconductor device according to the first embodiment illustrated in FIG. 1A. A moisture entry route is indicated by a thick line with an arrow. Moisture easily enters the semiconductor device from the edge of the opening 42 along an interface between the pad 40 and protective film 41. The moisture from the edge of the opening 42 reaches the bottom surface of the pad 40, then moves along the interface between the pad 40 and dielectric film 20, and enters the inside in an in-plane direction (transverse direction).

An evaluation conducted by the inventors of the present disclosure reveals that the film quality of the dielectric film 20 in the vicinity of an inside corner P in the bent section 31 is lower than that in the other regions. Moisture that reached the inside corner P in the bent section 31 passes through the dielectric film 20 having the low film quality and reaches the conductor 30. The moisture that reached the conductor 30 moves along the interface between the conductor 30 and each of the surrounding dielectric film 20 and first dielectric film 21 in the in-plane direction and then reaches the circuit element 45. This leads to corrosion of the conductor 30, degradation of the circuit element 45, or other undesired state.

Figure 5A:
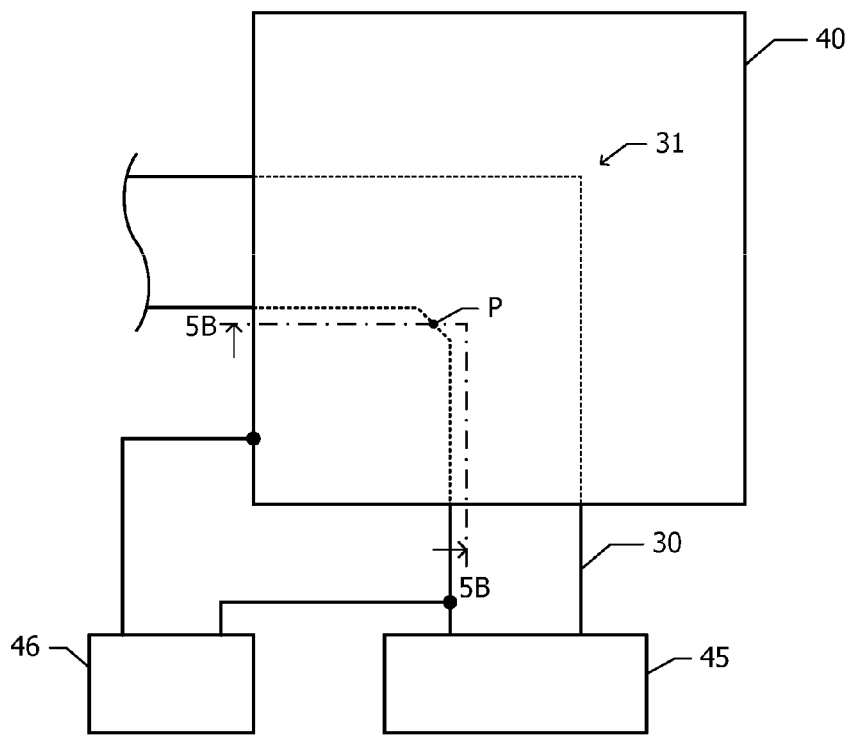
FIG. 5A is a plan view of the pad section in the semiconductor device according to the first embodiment.
Figure 5B:
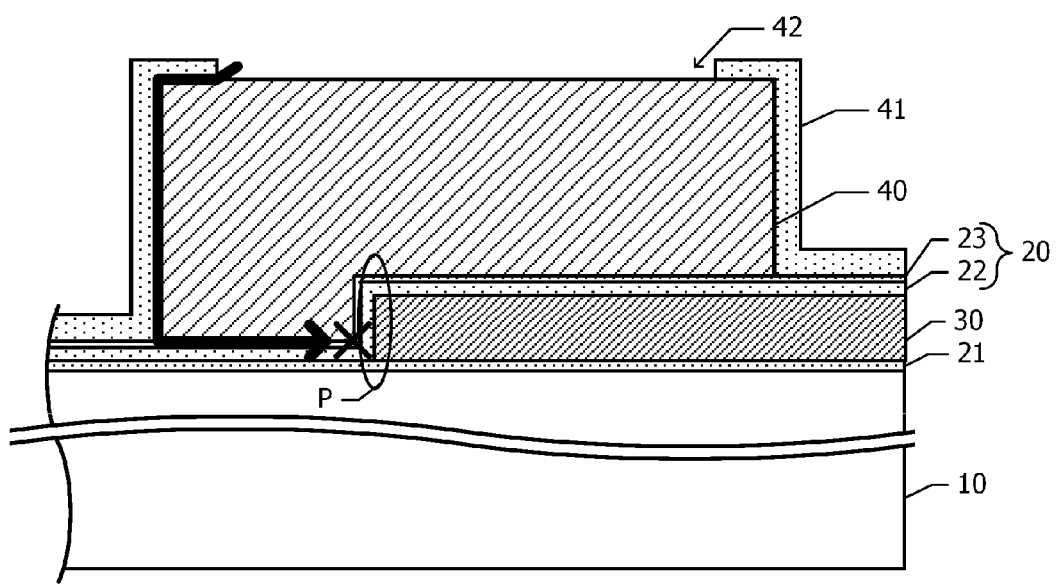
FIG. 5B is a cross-sectional view at a dot-and-dash line 5B-5B in FIG. 5A.

FIG. 5A is a plan view of the pad section in the semiconductor device according to the first embodiment, and FIG. 5B is a cross-sectional view at a dot-and-dash line 5B-5B in FIG. 5A. A circuit 46 including a ground conductor, a power source conductor, a signal processing circuit, an amplifier circuit, and other element is connected to the pad 40 and conductor 30. For example, one of the pad 40 and conductor 30 may be connected to the ground conductor in the circuit 46, and the other one may be connected to the power source conductor. One of the pad 40 and conductor 30 may be connected to the signal conductor inside the circuit 46.

In the first embodiment, the inside corner P in the bent section 31 in the conductor 30 is chamfered. The chamfered corner P leads to suppression of the reduction in the film quality of the dielectric film 20 in the vicinity of the corner P. With the improved film quality of the dielectric film 20, the moisture does not easily pass through the dielectric film 20. Thus, the moisture that reached the inside corner P in the conductor 30 does not easily enter the conductor 30. In addition, the moisture does not easily reach the circuit element 45. Consequently, the moisture resistance of the semiconductor device can be improved.

In particular, when Au is used in the pad 40, the adhesion between the protective film 41 and pad 40 is low, moisture easily enter their interface. In addition, when Au is used in the conductor 30, the adhesion between the conductor 30 and each of its surrounding dielectric film 20 and first dielectric film 21 is low, moisture easily enters the inside from the corner P toward the circuit element 45. Accordingly, for the semiconductor device in which Au is used in at least one of the pad 40 and conductor 30, the more noticeable advantage of improving the moisture resistance by chamfering the corner P is obtainable.

When the circuit 46 produces a potential difference between the pad 40 and conductor 30, if moisture comes into contact with both the pad 40 and conductor 30, an electrochemical reaction occurs, and the pad 40 and conductor 30 corrode. When the pad 40 and conductor 30 corrode, entry of the moisture and reduction of the moisture resistance accelerate. Accordingly, when the circuit 46 produces a potential difference between the pad 40 and conductor 30, the more noticeable advantage of improving the moisture resistance by chamfering the corner P is obtainable.

Next, a decrease in thermal stress is described. Simulation was conducted for verifying the advantage from chamfering the bent section 31 in the semiconductor device according to the first embodiment. The simulation method and simulation result are described below with reference to FIGS. 6A, 6B, and 7.

Figure 6A:
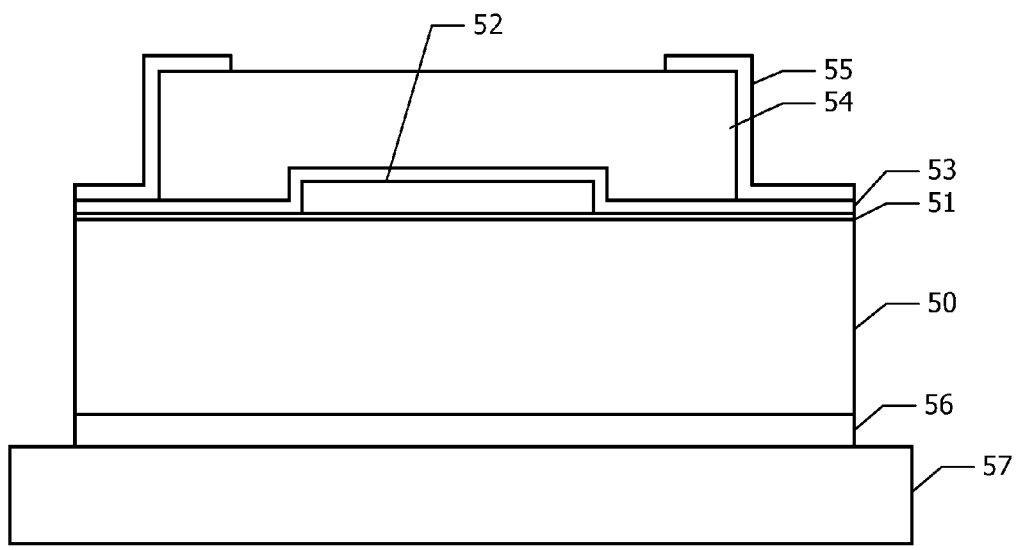
FIG. 6A is a cross-sectional view of a semiconductor device being a target of simulation.

FIG. 6A is a cross-sectional view of a sample being a target of the simulation. A working process for producing the sample is described below. First, a GaAs substrate 50 (corresponding to the semiconductor substrate 10 in FIG. 1A) is prepared. The initial temperature of the GaAs substrate 50 is 25° C. A SiN film 51 (corresponding to the first dielectric film 21 in FIG. 1A) with a thickness of 0.2 μm is formed on the GaAs substrate 50 under the condition of a temperature of 300° C. by plasma chemical-vapor deposition (plasma CVD).

A conductor 52 (corresponding to the conductor 30 in FIG. 1A) made of Au and having a thickness of 1 μm is formed on the SiN film 51 under the condition of a temperature of 80° C. by the application of the vacuum deposition and lift-off method.

Figure 6B:
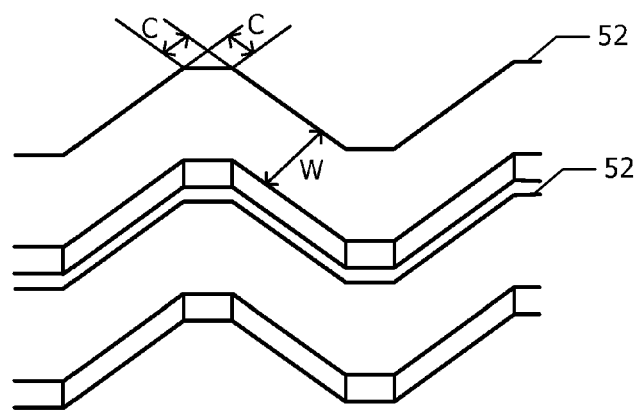
FIG. 6B is a perspective view of conductors.

FIG. 6B is a perspective view of the conductors 52. Each of the conductors 52 has a zigzag shape bent at right angles. Each of the outside corners and inside corners in the bent sections is chamfered so as to have an isosceles right triangle shape. The chamfer length is expressed as C, and the width of the conductor 52 is expressed as W.

A SiN film 53 (corresponding to the second dielectric film 22 and third dielectric film 23 in FIG. 1A) with a thickness of 0.4 μm is formed on the SiN film 51 and conductor 52 (FIG. 6A) under the condition of a temperature of 300° C. by the plasma CVD. A pad 54 (corresponding to the pad 40 in FIG. 1A) made of Au and having a thickness of 4 μm is formed on the SiN film 53 under the condition of a temperature of 80° C. by the application of the vacuum deposition and lift-off method.

A SiN film 55 (corresponding to the protective film 41 in FIG. 1A) with a thickness of 0.5 μm is formed on the SiN film 53 and pad 54 under the condition of a temperature of 300° C. by the plasma CVD. A Au film 56 with a thickness of 4 μm is formed under the condition of a temperature of 80° C. by the application of Au plating onto the back side of the GaAs substrate 50. The Au film 56 is bonded to a package substrate 57 under the condition of a temperature of 175° C. by the use of silver (Ag) paste.

After the above-described working process, thermal stress occurring in the SiN film 53 when the samples were heated to a temperature of 150° C. for wire bonding was determined by the simulation.

FIG. 7 illustrates graphs representing the simulation result. The horizontal axis expresses the chamfer length C in the unit μm, and the vertical axis expresses the stress occurring in the SiN film 53 in the unit MPa. The circle signs and square signs in FIG. 7 indicate the maximum values of the stress occurring in the inner side of the bent section and the maximum values of the stress occurring in the outer side of the bent section, respectively. The sample in which the chamfer length C is 0 μm corresponds to a structure in which no chamfering is conducted. It is revealed that the stress in the case where chamfering is conducted is lower than that in the case where no chamfering is conducted.

Simulation was also conducted to examine the differences between the advantage of reducing the stress for a sample in which only the inside corner in the bent section 31 is chamfered and that for a sample in which both corners are chamfered. Next, the result of that simulation is described with reference to FIGS. 8A, 8B, 8C, and 9.

Figure 8A:
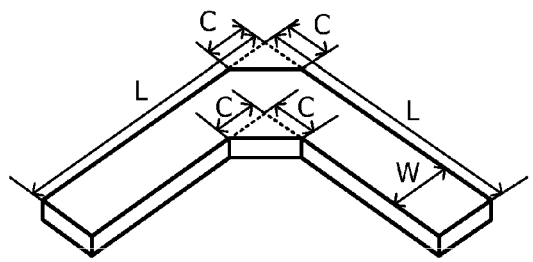
FIGS. 8A, 8B, and 8C are perspective views of sample conductors being targets of simulation.
Figure 8B:
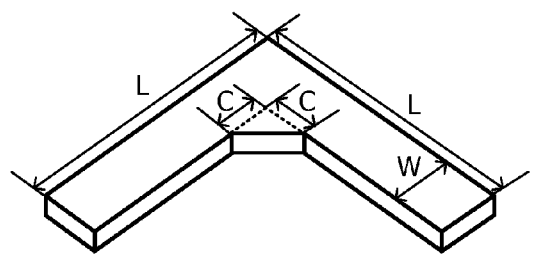
Figure 8C:
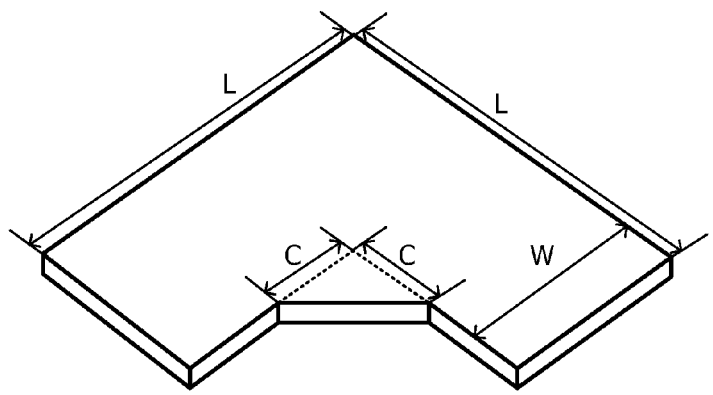

FIGS. 8A, 8B, and 8C are perspective views of a plurality of sample conductors being targets of the simulation. The cross-sectional structure and the production process of the samples being the targets of the simulation are the same as those of the sample illustrated in FIG. 6A.

In the sample illustrated in FIG. 8A, both the outside corner and inside corner in the bent section are chamfered. In each of the samples illustrated in FIGS. 8B and 8C, the inside corner in the bent section is chamfered, whereas the outside corner is not chamfered. The conductor width W in each of the samples illustrated in FIGS. 8A and 8B is 2 μm, and the length L of the conductor starting from the outside corner in the bent section is 12 μm. The conductor width W in the sample illustrated in FIG. 8C is 10 µm, and the length L of the conductor starting from the outside corner in the bent section is 21 µm.

FIG. 9 illustrates graphs representing the simulation result. The horizontal axis expresses the chamfer length C in the unit µm, and the vertical axis expresses the stress occurring in the SiN film 53 (FIG. 6A) in the unit MPa. The circle signs, triangle signs, and square signs in FIG. 9 indicate the maximum values of the stress occurring in the SiN films 53 in the vicinity of the bent sections in the samples illustrated in FIGS. 8A, 8B, and 8C, respectively. The sample in which the chamfer length C is 0 µm corresponds to a structure in which no chamfering is conducted.

It is revealed that in the case where the conductor width W is 10 µm and the outside corner is not chamfered (FIG. 8C), the maximum value of the stress is reduced by chamfering the inside corner. More specifically, it is confirmed that when the chamfer length C is equal to or larger than 1 µm and equal to or smaller than 5 µm, the advantage from chamfering is obtainable. It is revealed that in the case where the conductor width W is 2 µm and the outside corner is not chamfered (FIG. 8B), the advantage from chamfering is obtainable when the inside chamfer length C is 1 µm and the advantage from chamfering is not virtually obtainable when the chamfer length C is extended to 2 µm, that is, to the same length as the conductor width W. It can be considered from these evaluations that in the case where the inside corner is chamfered and the outside corner is not chamfered, when the chamfer length C is equal to or larger than 0.1 times and equal to or smaller than 0.5 times the conductor width W, the advantage of suppressing the occurrence of stress is obtainable.

It is revealed that in the case where the conductor width W is 2 µm and both the outside corner and inside corner are chamfered (FIG. 8A), when the chamfer length C is equal to or larger than 1 µm and equal to or smaller than 2 µm, the advantage of suppressing the occurrence of stress is obtainable. When the conductor width W is 10 µm and the chamfer length C in the inside chamfered region is 1 µm, the advantage of suppressing the occurrence of stress is obtainable. In consideration of that respect, it can be considered that in the case where both the outside corner and inside corner are chamfered, the chamfer length C may preferably be equal to or larger than 0.1 times and equal to or smaller than 1 time the conductor width W.

If stress occurs in the second dielectric film 22 and third dielectric film 23 (FIG. 1A), a crack is easily caused by an impact load occurring when wire bonding is performed on the pad 40 (FIG. 2A). For example, because the second dielectric film 22 and third dielectric film 23 in the vicinity of the lower end of the side surface of the conductor 30 in FIG. 1A tend to have a relatively low density and the stress tends to concentrate thereon, the risk of cracks is high.

When the dielectric film is formed by the CVD method or other similar method, the amount of gas for deposition tends to be insufficient in the bent section (in particular, the inner side of the bent section) of the conductor. Thus, there is a tendency in the portion in contact with the side surface on the inner side of the bent section to have a low density in the dielectric film, including the SiN film, and have a reduced film quality of that film. A crack occurring in the second dielectric film 22 and third dielectric film 23 having relatively lower densities is a leakage path between the pad 40 and conductor 30, and this may cause a short-circuit fault.

Moisture easily enters a region below the protective film 41 in the pad region where the opening 42 is present in the protective film 41. In addition, moisture may enter the dielectric film 20 positioned in the vicinity of the bent section and having a low density and low film quality and may reach the conductor 30. In the bent section in which large stress occurs, a gap easily appears in the interface between the conductor 30 and dielectric film 20, and a crack easily occurs in the dielectric film 20. If moisture is stored in the gap or crack, the reduced moisture resistance causes a failure in the bent section. The reason why a gap easily appears in the interface between the conductor 30 and dielectric film 20 is that the adhesion between the conductor 30 made of Au and the dielectric film 20 is weaker than that between a conductor made of Al and the dielectric film. In the first embodiment, because the stress occurring in the bent section is decreased, the occurrence of failures caused by the reduction in the moisture resistance can be suppressed. In particular, for the case where Au is used in the conductor 30, the noticeable advantage provided by the adoption of the configuration of the first embodiment is obtainable.

Substantially the same advantage is also obtainable in the cases where bumps (FIGS. 2B and 2C) are disposed in place of wire bonding. Examples of the bumps may be the solder ball bump 61 (FIG. 2B) and the Cu pillar bump 64 (FIG. 2C). In both cases, because the protective film 41, which covers the pad 40, has the opening 42, substantially the same advantage for improvement in the moisture resistance as that in the wire bonding case is obtainable. One example problem may be that moisture moves from the outside along the interface between the solder ball bump 61 and protective film 41 to the opening 42 and then enters the inside along a route similar to the route illustrated in FIGS. 4A and 4B. Thus, the explanation about the improvement in the moisture resistance by the bent conductor structure can also be applied to the case where the solder ball bump 61 (FIG. 2B) is disposed. As for the configuration including the Cu pillar bump 64, because moisture easily moves from the outside to the opening 42 along the interface between the Cu pillar bump 64 and protective film 41, the explanation about the improvement in the moisture resistance by the bent conductor structure can also be applied.

The same applies to a decrease in thermal stress. In a process of melting solder and performing face-down mounting on a mounting substrate, the pad 40 and near members experience a temperature cycle. At that time, because thermal stress additionally occurs in the dielectric film 20 below the pad 40, the stress occurring in the bent section increases. In the first embodiment, because the stress occurring in the bent section is decreased, even when the bump is formed on the pad, the occurrence of failures caused by a reduction in the moisture resistance can be suppressed.

Typically, internal stress occurring in a silicon nitride film formed by the plasma CVD or other similar method is larger than that in a silicon oxide film. Thus, when silicon nitride is used in the dielectric film 20, a malfunction caused by the stress more easily occur in comparison with the case where silicon oxide is used. When silicon nitride is used in the dielectric film 20, the noticeable advantage by the adoption of the configuration of the first embodiment is obtainable.

In the first embodiment, the stress occurring in the second dielectric film 22 and third dielectric film 23 (FIG. 1A) is reduced. Thus, a crack does not easily occur, and the reliability can be enhanced.

In FIG. 3B, if the chamfer length C in the outside chamfered region 35 is longer than the conductor width W and the chamfered region 35 extends beyond the overlapping region 36, a larger region is needed to have a predetermined width of the bent section 31. In the first embodiment, because the outside chamfered region 35 in the bent section 31 is contained in the overlapping region 36, an increase in the area of the region needed for the bent section 31 can be suppressed.

Next, variations of the first embodiment are described with reference to FIGS. 10A and 10B.

Figure 10A:
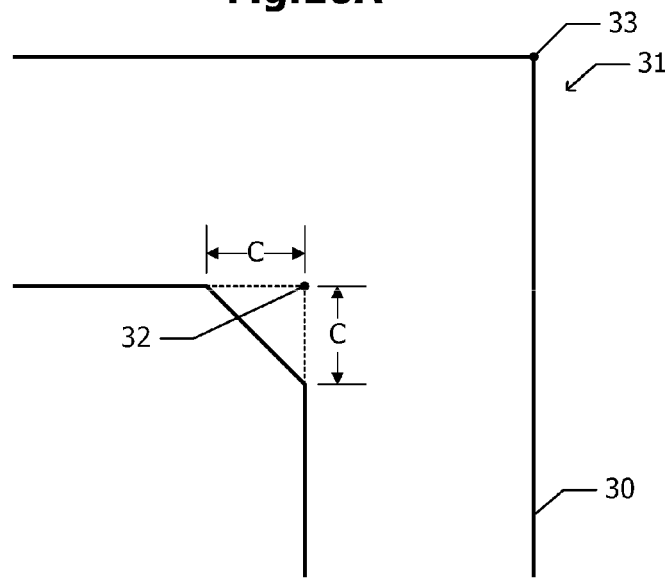
FIGS. 10A and 10B are plan views of bent sections in conductors in semiconductor devices according to a first variation and a second variation of the first embodiment, respectively.
Figure 10B:
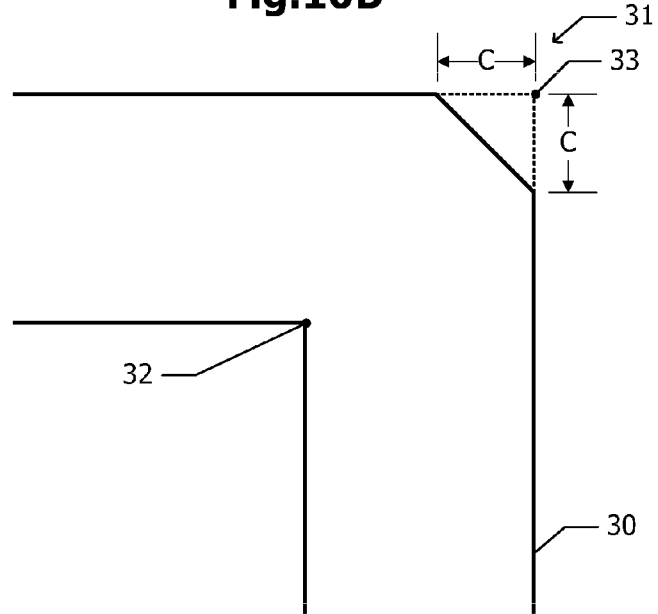

FIGS. 10A and 10B are plan views of the bent section 31 in the conductor 30 according to a first variation and a second variation of the first embodiment, respectively. In the first variation illustrated in FIG. 10A, the inside corner 32 in the bent section 31 is chamfered, whereas the outside corner 33 is not chamfered. In the second variation illustrated in FIG. 10B, the outside corner 33 is chamfered, whereas the inside corner 32 is not chamfered.

As in the first and second variations of the first embodiment, when only one of the outside and inside corners is chamfered, the advantage of reducing the stress is obtainable. As illustrated in FIG. 7, because the stress is large in the vicinity of the inside corner, the inside corner may preferably be chamfered. In that case, the chamfer length C may preferably be not larger than the conductor width W.

In the above-described first embodiment, the first dielectric film 21 (FIG. 1A) is arranged between the semiconductor substrate 10 and conductor 30. The first dielectric film 21 is optional. The conductor 30 may be arranged directly on the semiconductor substrate 10. In that case, the semiconductor substrate 10 in the region where the conductor 30 is arranged may preferably be made to be insulative by ion injection or other similar method. Substantially the same advantage as that in the first embodiment is obtainable from the structure where the conductor 30 is arranged between the semiconductor substrate 10 and dielectric film 20, regardless of the presence or absence of the first dielectric film 21. The thicknesses and the like of the dielectric films and conductors are not limited to values and specifications described in the description on the first embodiment, and various modifications may be made.

Second Embodiment

Next, a semiconductor device according to a second embodiment is described with reference to FIGS. 11A and 11B. The configuration common to the semiconductor device according to the first embodiment is not described here.

Figure 11A:
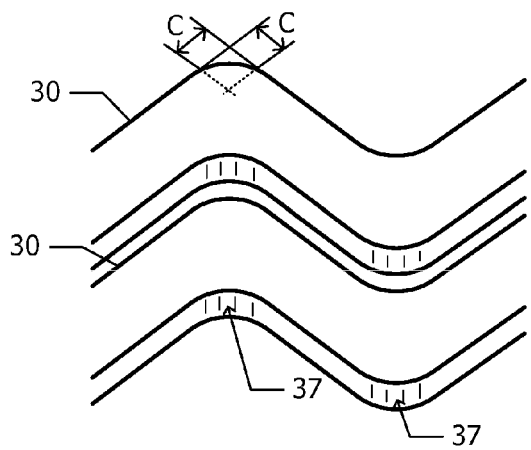
FIG. 11A is a perspective view of conductors in a semiconductor device according to a second embodiment.

FIG. 11A is a perspective view of the conductors 30 in the semiconductor device according to the second embodiment. In the first embodiment, the inside and outside chamfered surfaces 37 (FIG. 3A) in the bent section 31 in each of the conductors 30 are plane. In the second embodiment, the chamfered surfaces 37 are round surfaces. That is, each of the chamfered surfaces 37 constitutes a portion of a cylindrical surface being in contact with the side surface of the straight-line segment of the conductor 30.

Figure 11B:
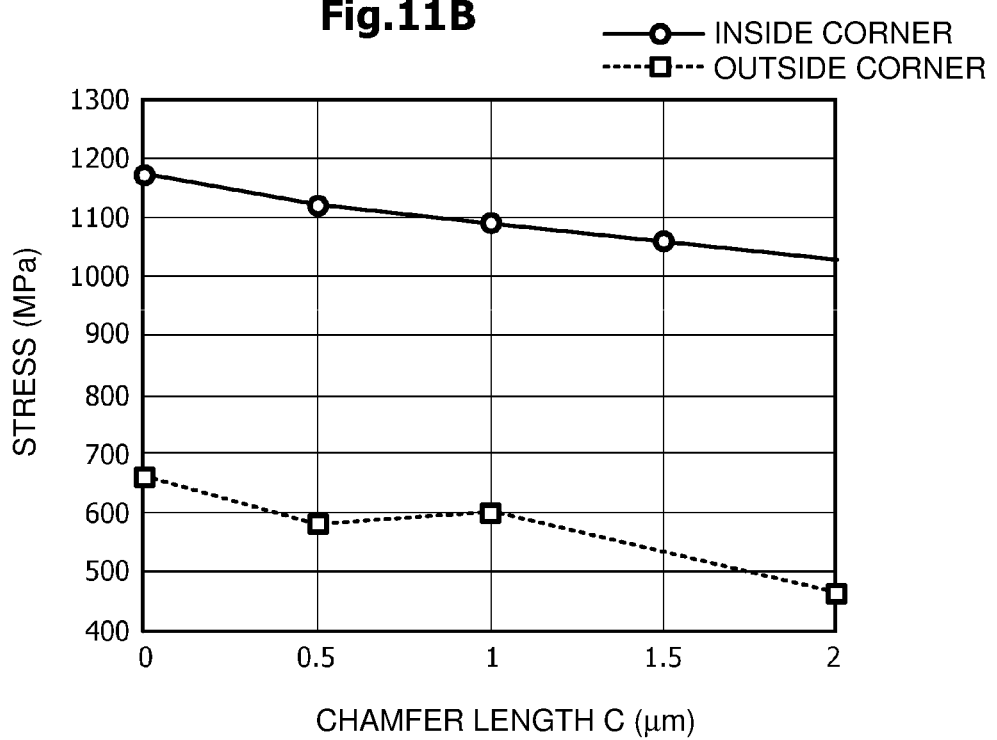
FIG. 11B illustrates graphs representing a result of simulation for stress occurring in the semiconductor device according to the second embodiment.

FIG. 11B illustrates graphs representing a result of simulation for stress occurring in the semiconductor device according to the second embodiment. The horizontal axis expresses the chamfer length C in the unit μm, and the vertical axis expresses the stress occurring in the SiN film 53 (FIG. 6A) in the unit MPa. The chamfer length C is equal to the radius of curvature of the round surface. The circle signs and square signs in FIG. 11B indicate the maximum values of the stress occurring in the vicinity of the inner side of the bent section and the maximum values of the stress occurring in the vicinity of the outer side of the bent section, respectively. The sample in which the chamfer length C is 0 μm corresponds to a structure in which no chamfering is conducted.

It is revealed that when the inside corner and outside corner in the bent section in the conductor 30 are rounded, the stress is reduced in comparison with the case where no chamfering is conducted, as in the first embodiment.

[Various Variations]

Next, variations of the above-described first and second embodiments are described with reference to FIGS. 12A to 12G. The chamfered surface in the right-angled bent section 31 (FIG. 3A) in the conductor 30 may have shapes described below.

(1) The chamfered surface is plane, and the chamfered region has an isosceles right triangle shape.
(2) The chamfered surface is plane, and the chamfered region has a scalene triangle shape.
(3) The chamfered surface is a round surface.
(4) The chamfered surface is a surface of a polygonal prism shape including one or more corner sections.

The outside chamfered surface and inside chamfered surface in the bent section 31 can have any shape selected from combinations of the shapes (1) to (4) described above. The first embodiment (FIGS. 3A and 3B) corresponds to an example in which the outside and inside chamfered surfaces are both (1), and the outside chamfered region of the isosceles right triangle shape and the inside chamfered region of the isosceles right triangle shape have the same-length hypotenuses. The second embodiment (FIGS. 11A and 11B) corresponds to an example in which the outside and inside chamfered surfaces are both (3), and both the chamfered surfaces have the same radius of curvature.

FIGS. 12A to 12G illustrate two-dimensional shapes of the bent sections 31 in the conductors 30 in the semiconductor devices according to various variations of the first and second embodiments.

Figure 12A:
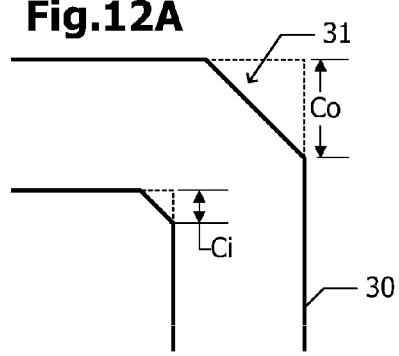
FIGS. 12A to 12G illustrate two-dimensional shapes of bent sections in conductors in semiconductor devices according to various variations of the first and second embodiments.
Figure 12B:
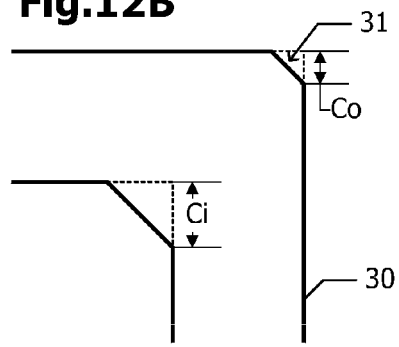

In the variations illustrated in FIGS. 12A and 12B, both the outside and inside chamfered regions have the shape of (1). In the variation illustrated in FIG. 12A, the chamfer length Co of the outside chamfered surface is longer than the chamfer length Ci of the inside chamfered surface. In contrast, in the example illustrated in FIG. 12B, the chamfer length Ci of the inside chamfered surface is longer than the chamfer length Co of the outside chamfered surface.

Figure 12C:
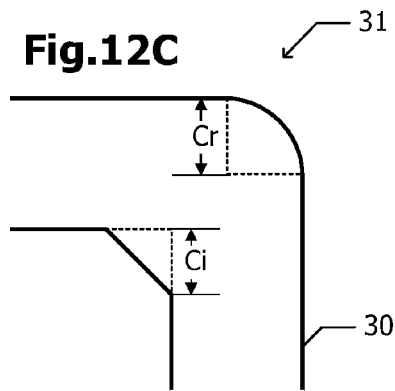

In the variation illustrated in FIG. 12C, the outside chamfered surface has the shape of (3), and the inside chamfered surface has the shape of (1). The chamfer length Ci of the inside chamfered surface and the radius of curvature Cr of the outside chamfered surface may be the same or different.

Figure 12D:
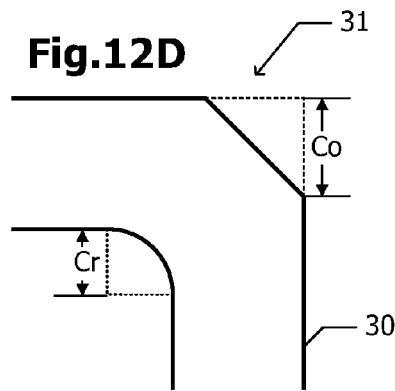

In the variation illustrated in FIG. 12D, the outside chamfered surface has the shape of (1), and the inside chamfered surface has the shape of (3). The chamfer length Co of the outside chamfered surface and the radius of curvature Cr of the inside chamfered surface may be the same or different.

Figure 12E:
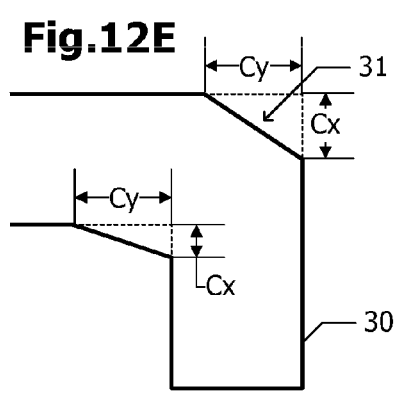

In the variation illustrated in FIG. 12E, both the outside and inside chamfered surfaces have the shape of (2). The inside and outside chamfered regions have scalene triangle shapes, each of whose one interior angle is a right angle. The lengths of two sides forming the right angle (chamfer length) in each of the inside and outside chamfered regions are expressed as Cx and Cy. In the first embodiment, because the chamfered region has an isosceles right triangle shape, the chamfer lengths Cx and Cy are the same. In the example illustrated in FIG. 12E, the chamfer lengths Cx and Cy are different. The ratio between the chamfer lengths Cx and Cy in the inside chamfered region and that in the outside chamfered region may be the same or different.

Figure 12F:
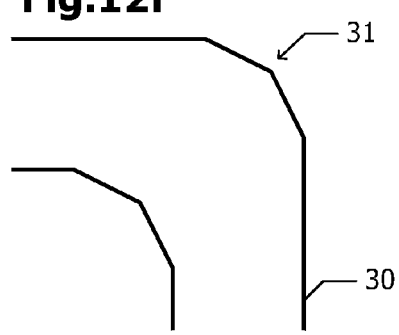

In the variation illustrated in FIG. 12F, both the outside and inside chamfered surfaces have the shape of (4). The two-dimensional shape of the outside chamfered surface constitutes a portion of a polygon, and its interior angle is less than 180°. The two-dimensional shape of the inside chamfered surface also constitutes a portion of a polygon, and its interior angle is larger than 180°. FIG. 12F illustrates an example in which each of the outside and inside chamfered surfaces has one angle. They may have two or more angles. The number of corners in the outside chamfered surface and that in the inside chamfered surface may be different.

Figure 12G:
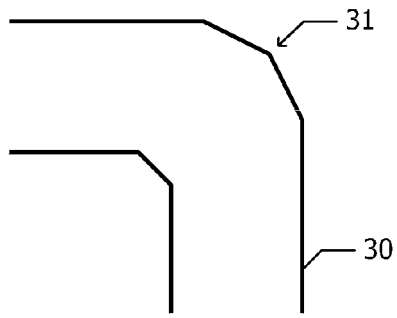

In the variation illustrated in FIG. 12G, the inside chamfered surface has the shape of (1), and the outside chamfered surface has the shape of (4). In contrast to this variation, the inside chamfered surface may have the shape of (4), and the outer chamfered surface may have the shape of (1).

In the semiconductor devices according to the variations illustrated in the drawings of FIGS. 12A to 12G, the stress occurring in the dielectric film 20 can be reduced, as in the semiconductor devices according to the first and second embodiments. Consequently, the reduction in the reliability of the semiconductor devices can be suppressed. Moreover, in semiconductor devices in which the chamfered surface in the outside corner and that in the inside corner in the bent section 31 have any shape selected from the combinations of (1) to (4) described above, the stress occurring in the dielectric film 20 can be reduced.

Third Embodiment

Next, a semiconductor device according to a third embodiment is described with reference to FIG. 13. The configuration common to the semiconductor device according to the first embodiment or second embodiment is not described here.

Figure 13:
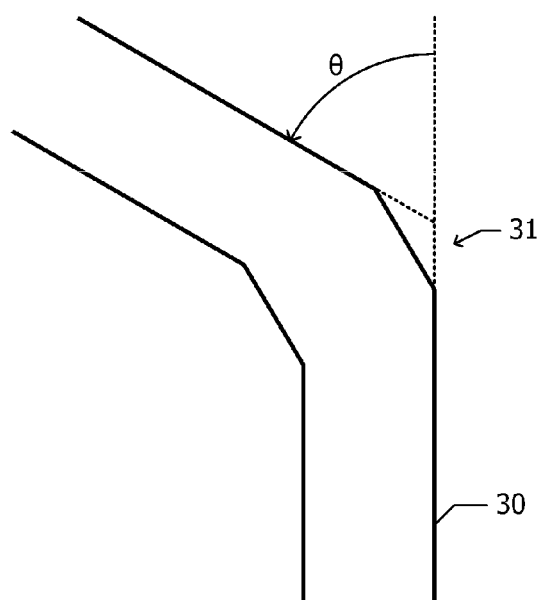
FIG. 13 is a plan view of a bent section in a conductor in a semiconductor device according to a third embodiment.

FIG. 13 is a plan view of the bent section 31 in the conductor 30 in the semiconductor device according to the third embodiment. In the first and second embodiments, the conductor 30 is bent at a right angle at the bent section 31 (FIGS. 3A, 3B, and other drawings). In the third embodiment, the bent angle θ of the conductor 30 at the bent section 31 is smaller than 90°. Thus, the segments of the conductor 30 on both sides of the bent section 31 meet at an obtuse angle.

In the case where the bent angle θ of the conductor 30 is smaller than 90°, when at least one of the outside corner and inside corner is chamfered, the stress occurring in the dielectric film 20 can be reduced.

Fourth Embodiment

Next, semiconductor device according to a fourth embodiment is described with reference to FIG. 14. The configuration common to the semiconductor device according to the first embodiment or second embodiment is not described here.

Figure 14:
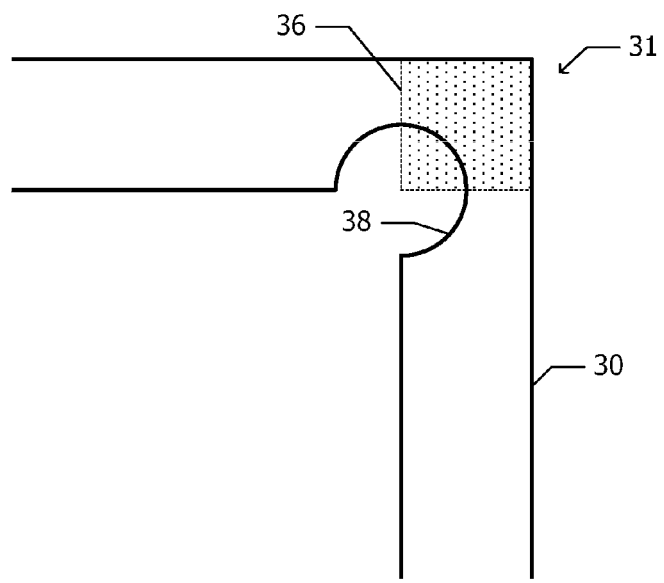
FIG. 14 is a plan view of a bent section in a conductor in a semiconductor device according to a fourth embodiment.

FIG. 14 is a plan view of the bent section 31 in the conductor 30 in the semiconductor device according to the fourth embodiment. In the first embodiment, the chamfered region 34 for the inside corner in the bent section 31 (FIG. 3B) is added outside the overlapping region 36. In the fourth embodiment, the inside corner in the bent section 31 is cut along a sharp curve 38. FIG. 14 illustrates an example in which the sharp curve 38 is an arc. The inner side surface of the bent section 31 passes through the inside of the overlapping region 36.

Next, advantages of the semiconductor device according to the fourth embodiment are described. The simulation result illustrated in FIG. 7 reveals that the stress occurring in the vicinity of the inside corner in the bent section 31 is larger than that in the vicinity of the outside corner. It can be considered from that result that the stress is larger in the vicinity of the corner section where its interior angle is 270° in the bent section 31. In the fourth embodiment, the bent section 31 does not include a corner section where its interior angle is larger than 270°. Thus, the stress occurring in the dielectric film 20 (FIG. 1A) can be reduced.

The above-described embodiments are illustrative, and the configurations illustrated in different embodiments may be replaced in part or combined. Substantially the same operational advantages provided by substantially the same configurations in a plurality of embodiments are not described in succession for each embodiment. Furthermore, the present disclosure is not limited to the above-described embodiments. For example, it is obvious for those skilled in the art that the above-described embodiments may be changed, modified, combined, and the like variously.

What is claimed is:

1. A semiconductor device comprising:
    a semiconductor substrate;
    a dielectric film disposed on the semiconductor substrate;
    a conductor arranged between the semiconductor substrate and the dielectric film and including a bent section;
    a pad disposed on the dielectric film; and
    a protective film that covers the pad and has an opening through which an upper surface of the pad is exposed,
    wherein the bent section in the conductor and the pad overlap each other as seen in plan view,
    at least one of an inside corner and an outside corner in the bent section is chamfered, and
    an entire width of the bent section of the conductor is disposed within a periphery of the opening.

2. The semiconductor device according to claim 1, wherein the inside corner in the bent section is chamfered.

3. The semiconductor device according to claim 2, further comprising a bump arranged on the pad or a wire bonded to the pad,
    wherein a material of the conductor includes gold.

4. The semiconductor device according to claim 2, wherein the dielectric film is a silicon nitride film.

5. The semiconductor device according to claim 2, further comprising a circuit configured to produce a potential difference between the pad and the conductor.

6. The semiconductor device according to claim 2, wherein the pad includes gold.

7. The semiconductor device according to claim 2, wherein the outside corner in the bent section is also chamfered.

8. The semiconductor device according to claim 7, wherein a region removed by chamfering the outside corner in the bent section is contained in a region where a region extended from a straight-line segment of the conductor contiguous to the bent section and a region extended from another straight-line segment thereof overlap each other.

9. The semiconductor device according to claim 8, wherein
    the conductor is bent at the bent section at a right angle, and
    a two-dimensional shape of the region removed by chamfering the outside corner in the bent section and a two-dimensional shape of a region added by chamfering the inside corner are isosceles right triangles.

10. The semiconductor device according to claim 8, wherein at least one of the inside corner and the outside corner in the bent section is rounded.

11. The semiconductor device according to claim 8, wherein at least one of the inside corner and the outside corner in the bent section is chamfered so as to have a surface of a polygonal prism shape including one or more corner sections.

12. The semiconductor device according to claim 7, wherein the conductor is bent at the bent section at a right angle, and a two-dimensional shape of the region removed by chamfering the outside corner in the bent section and a two-dimensional shape of a region added by chamfering the inside corner are isosceles right triangles.

13. The semiconductor device according to claim 12, wherein the region having the isosceles right triangle shape removed by chamfering the outside corner in the bent section and the region having the isosceles right triangle shape added by chamfering the inside corner are the same size.

14. The semiconductor device according to claim 7, wherein at least one of the inside corner and the outside corner in the bent section is rounded.

15. The semiconductor device according to claim 7, wherein at least one of the inside corner and the outside corner in the bent section is chamfered so as to have a surface of a polygonal prism shape including one or more corner sections.

16. The semiconductor device according to claim 7, further comprising a bump arranged on the pad or a wire bonded to the pad, wherein a material of the conductor includes gold.

17. The semiconductor device according to claim 1, further comprising a bump arranged on the pad or a wire bonded to the pad, wherein a material of the conductor includes gold.

18. The semiconductor device according to claim 1, wherein the dielectric film is a silicon nitride film.

19. The semiconductor device according to claim 1, further comprising a circuit configured to produce a potential difference between the pad and the conductor.

20. The semiconductor device according to claim 1, wherein the pad includes gold.

* * * * *